United States Patent [19]

Uenishi et al.

[11] Patent Number: 4,923,689

[45] Date of Patent: May 8, 1990

[54] ALUMINUM NITRIDE POWER HAVING IMPROVED WATER-RESISTANCE

[75] Inventors: Masatoshi Uenishi, Fujiidera; Yoshiki Hashizume, Kawachi-Nagano; Takamasa Yokote, Nara, all of Japan

[73] Assignee: Toyo Aluminium Kabushiki Kaisha, Osaka, Japan

[21] Appl. No.: 381,066

[22] Filed: Jul. 18, 1989

[30] Foreign Application Priority Data

| | | | |
|---|---|---|---|
| Aug. 1, 1988 | [JP] | Japan | 63-192265 |
| Aug. 1, 1988 | [JP] | Japan | 63-192266 |
| Jul. 17, 1989 | [JP] | Japan | 1-183885 |
| Jul. 17, 1989 | [JP] | Japan | 1-183886 |

[51] Int. Cl.[5] .................... C01B 21/072

[52] U.S. Cl. .................... 423/267; 423/268; 423/412

[58] Field of Search .................... 423/267, 268, 412

[56] References Cited

FOREIGN PATENT DOCUMENTS 13392 7/1974 Japan .................... 423/267

69761 3/1988 Japan .

OTHER PUBLICATIONS

Chemical Abstracts, 109:26713d, (1988).

Chemical Abstracts, 108(8):61337k, (1987).

*Primary Examiner*—John Doll

*Assistant Examiner*—Wayne A. Langel

*Attorney, Agent, or Firm*—Nixon & Vanderhye

[57] ABSTRACT

Disclosed herein is an aluminum nitride powder having the improved water-resistance, which is obtained by treating the aluminum nitride powder with an inorganic or organic phosphoric acid compound followed by heating at about 150° to 800° C. when the organic phosphoric acid compound is used.

13 Claims, No Drawings

ALUMINUM NITRIDE POWER HAVING IMPROVED WATER-RESISTANCE

FIELD OF THE INVENTION

The present invention relates to an aluminium nitride powder having the improved water-resistance. And, the present invention relates to a method for treating an aluminium nitride powder to improve its water-resistance.

BACKGROUND OF THE INVENTION

The aluminium nitride has been known to have the high thermal conductivity and employing this property, a sintered body of aluminium nitride is available as a ceramics. And, the aluminium nitride powder has been proposed to use as a filler for encapsulating material for IC and a filler for a synthetic resin or rubber admixture, including an adhesive.

While, the aluminium nitride has the property of easily reacting with water, thereby it being easily hydrolyzed to decompose into a hydrated alumina with the production of ammonia. Because of this property, the following problems are caused.

(a) When the aluminium nitride powder is shaped by slip casting, tape casting etc. and then sintered so as to prepare the sintered body, water cannot be used as a shaping medium. Therefore, the shaping methods should be limited and the organic solvent should be used as the shaping medium. For this, the production cost is higher and the danger of explosion may occur.

If water is used as the shaping medium, the sintered body having the desired thermal conductivity cannot be obtained because the oxygen content in the aluminium nitride-powder remarkably increases by the reaction with water.

(b) The aluminium nitride powder should be stored under the severe conditions because it is readily subjected to the hydrolysis by the moisture in the atmosphere. If the aluminium nitride powder is stored under the unsuitable conditions, therefore, the oxygen content therein may progressively and remarkably increase.

When the aluminium nitride powder is used as the filler, the quality of the filler may be impaired during the storage and usage.

As the method for solving these problems, the method for improving the water-resistance of the aluminium nitride powder was proposed. This method comprises heating the aluminium nitride powder at about 600 to 800° C. to form the aluminium oxide coatings on the surface of each particle. However, the water-resistance of the aluminium nitride powder cannot be stably kept for a long period.

An object of the present invention is to provide the aluminium nitride powder having the stable water resistance for a long period.

An other object of the present invention is to provide the aluminium nitride powder which is suitable as the starting material for preparing the sintered body of aluminium nitride.

A further object of the present invention is to provide the aluminium nitride powder which is suitable as the filler for encapsulating material for IC and the filler for the synthetic resin or rubber admixture.

A further object of the present invention is to provide a method for treating the aluminium nitride powder so as to improve its water-resistance.

SUMMARY OF THE INVENTION

Now, the present inventors found that the aluminium nitride powder having the improved water-resistance can be obtained by treating the aluminium nitride powder with an inorganic or organic phosphoric acid compound.

Accordingly, the present invention provides the aluminium nitride powder having the improved water-resistance, which is treated with the inorganic phosphoric acid compound.

And, the present invention provides the aluminium nitride powder having the improved water-resistance, which is treated with the organic phosphoric acid compound followed by heating at about 150 to 800° C.

Further, the present invention provides a method for treating an aluminium nitride powder with an inorganic or organic phosphoric acid compound so as to improve its water-resistance.

DETAILED DESCRIPTION OF THE INVENTION

The aluminium nitride powder to be treated with the inorganic or organic phosphoric acid compound is not particularly limited. The aluminium nitride powder is generally prepared according to a direct nitriding method in which aluminium is heated in nitrogen or an alumina reducing method in which a mixture of alumina and carbon is heated in nitrogen. Usually, the aluminium nitride powder used has the average particle size of about 0.1 μm to about 1 mm.

When the inorganic or organic phosphoric acid compound is used for treating the aluminium nitride powder, it is preferably used in an amount of 0.1 to 10 parts by weight, more preferably 0.2 to 3 parts by weight based on 100 parts by weight of the aluminium nitride powder. If the above amount is less than 0.1 part by weight, the improvement in the water-resistance of the aluminium nitride powder is not sufficient. On the other hand, if the amount is above 10 parts by weight, the oxygen content in the aluminium nitride powder is too increased.

The inorganic phosphoric acid compound used for treating the aluminium nitride powder includes orthophosphoric acid, pyrophosphoric acid, polyphosphoric acid, phosphorous acid, hypophosphorous acid, metaphosphoric acid and a mixture thereof.

The organic phosphoric acid compound used for treating the aluminium nitride powder includes

- an acid phosphate represented by $(RO)_2P(O)OH$ or $ROP(O)(OH)_2$ wherein R is alkyl, alkenyl or aryl group having 1 to 18 carbon atoms, the illustrations of which are methyl acid phosphate, ethyl acid phosphate, butyl acid phosphate, 2-ethylhexyl acid phosphate, lauryl acid phosphate, palmityl acid phosphate, stearyl acid phosphate, oleyl acid phosphate, phenyl acid phosphate or nonylphenyl acid phosphate;
- an alkyl-, alkenyl- or aryl-ester of pyrophosphoric or polyphosphoric acid, the illustration of which is di-2-ethylhexyl pyrophosphate;
- an phosphonic acid or an ester thereof, the illustrations of which are methylene phosphonic acid, amino methylene phosphonic acid, (t-butyl)nitrilobis methylene phosphonic acid, (n-butyl)nitrilobis methylene phosphonic acid, nitrilotris methylene phosphonic acid, ethylene diamine tetramethylene phosphonic acid, 1-hydroxyethylidene-1,1-diphosphonic acid, butyl hydrogenphosphite, 2-ethylhexyl hydrogenphosphite, lauryl hydrogenphosphite or dibutylhydroxymethyl phosphonate; and a mixture thereof.

The organic phosphoric acid compound in the form of alkali metal salt should not be used because such a phosphoric acid metal salt is not dissolved in a solvent used for the treatment and the metal part may remain in the resultant aluminium nitride powder.

For treating the aluminium nitride powder to improve its water-resistance for obtaining the desired aluminium nitride powder of the present invention, the aluminium nitride powder is firstly dispersed in a suitable solvent. To the resultant dispersion with stirring, the inorganic or organic phosphoric acid compound is added dropwise to react with the aluminium nitride. After the reaction is completed, the solvent is removed by any conventional method such as evaporation so as to form a hydrophilic coating on the surface of each aluminium nitride particle.

As the solvent in which the aluminium nitride powder is dispersed, a lower ($C_1$–$C_4$) alcohol such as ethanol, isopropanol or butanol is preferably used. The lower alcohol may be used together with other solvent which is compatible therewith, such as a lower or medium alkane (for example, n-hexane, n-octane or n-decane) or acetone. However, the use of water in the solvent should be avoided, provided that it is unnecessary to dry the solvent by the additional and special operation(s). The above solvent is used for dispersing the aluminium nitride powder and at the same time as a solvent for the inorganic or organic phosphoric acid compound. Therefore, when the inorganic or organic phosphoric acid compound is added to the dispersion, the inorganic or organic phosphoric acid compound is preferably dissolved in a solvent which is same as the solvent for dispersing the aluminium nitride powder.

The reaction temperature between the aluminium nitride and the inorganic or organic phosphoric acid compound is not particularly limited. Generally it is in a range of from room temperature to 80° C., preferably from 40 to 60° C.

The reaction period between the aluminium nitride and the inorganic or organic phosphoric acid compound is not particularly limited. Generally, the reaction mixture is preferably kept for at least 3 hours after the completion of adding the inorganic or organic phosphoric acid compound in the dispersion.

When the organic phosphoric acid compound is used for treating the aluminium nitride powder, the following heating treatment is essential to form the hydrophilic coating on the surface of each aluminium nitride particle by thermally decomposing the organic phosphoric acid. The heating treatment is generally carried out at a temperature of about 150 to 800° C., preferably about 350 to 600° C. under the usual atmosphere, the vacuum atmosphere or the inert gas atmosphere. If the heating temperature is less than 150° C., the thermal decomposition of the organic phosphoric acid compound is not enough, thereby the expected aluminium nitride powder cannot be obtained. On the other hand, if the heating temperature is above 800° C., the aluminium nitride powder tends to be oxidized and flocculated. And, the heating period will vary depending on mainly the nature of the organic phosphoric acid compound and it is generally in a range of from about 30 minutes to 24 hours.

Alternatively, it is possible to improve the water-resistance for obtaining the desired aluminium nitride powder of the present invention by dry- or wet-type milling the aluminium nitride powder in the presence of the inorganic or organic phosphoric acid compound at room temperature. When the inorganic phosphoric acid compound is used, the wet-type milling is preferable. That is, the inorganic phosphoric acid compound is dissolved in a solvent, usually a solvent having the lower boiling point, to which the aluminium nitride powder is added and then milled. The above solvent also acts as the milling medium. When the organic phosphoric acid compound is used, the aluminium nitride powder is subjected to the dry-type milling with the organic phosphoric acid compound followed by reacting therebetween and heating the resultant powder at about 150 to 800° C.

EXAMPLES

The following examples will more fully illustrate the embodiments of the present invention.

Example 1

To an ethanol (250 ml) in a vessel having 1l capacity, an aluminium nitride powder (100 g) having the average particle size of 4.3 μm and the oxygen content of 0.66 % was added and mixed with stirring to prepare an aluminium nitride dispersion. The dispersion was warmed to about 80° C. while stirring by vibrating the vessel on the water bath.

Next, a solution of 85 % orthophosphoric acid (3 g) in ethanol (50 ml) was added dropwise to the dispersion to react the aluminium nitride with the orthophosphoric acid slowly. Dry inert gas was passed through the vessel for preventing the penetration of water into the system during the reaction.

After the completion of the reaction, the excess orthophosphoric acid was washed away with an ethanol until the pH value on the pH-test paper became above 5 and then the remaining ethanol was evaporated in a dryer at 80° C. to obtain the aluminium nitride powder treated with the orthophosphoric acid.

The above procedure was repeated except that the orthophosphoric acid was replaced with a polyphosphoric acid or other acids (technical grade products) which were soluble in ethanol to obtain the aluminium nitride powders treated with the acids.

The water-resistance of each of the resultant aluminium nitride powders was examined.

The aluminium nitride powder (4.1 g) was added to the pure water (54 g) having pH of about 5.6 and a temperature of 80° C. and mixed with stirring to prepare an aluminium nitride dispersion. Then, the pH change at 80° C. with time was determined with the pH-test paper.

The results are shown in Table 1.

TABLE 1

| treating agent | immediately after | 10 minutes after | 5 hours after |
|---|---|---|---|
| untreated | 9.0 | >9.6 | — |
| invention | | | |
| orthophosphoric acid (85%) | 5.6 | 5.6 | 5.6 |
| polyphosphoric acid (105%) | 5.6 | 5.6 | 6.2 |
| polyphosphoric acid (115%) | 5.6 | 5.6 | 7.4 |
| Comparison | | | |
| sulfuric acid | 5.6 | >9.6 | |
| oxalic acid | 8.6 | >9.6 | |
| boric acid | 8.6 | >9.6 | |

TABLE 1-continued

| treating agent | immediately after | 10 minutes after | 5 hours after |
|---|---|---|---|
| acetic acid | 5.6 | >9.6 | |

As clear from the results in Table 1, the aluminium nitride powders treated with the inorganic phosphoric acid compounds according to the present invention showed almost no or no pH change even if the dispersion was stored for 5 hours after its preparation. While, in the aluminium nitride powders treated with the other acids the pH value raised above 9.6 after 10 minutes of the preparation of the dispersion. An odor characteristic of ammonia was also detected.

The structures of the aluminium nitride powder treated with the orthophosphoric acid according to the present invention and the untreated aluminium nitride powder were analyzed according to the X-ray diffraction method before and after the water-resistance test.

The X-ray diffraction pattern in the aluminium nitride powder treated with the orthophosphoric acid showed no difference before and after the water-resistance test. Only the peaks resulting from the presence of aluminium nitride were observed in the X-ray diffraction pattern even after the water-resistance test. While, in the untreated aluminium nitride, the peaks resulting from the presences of aluminium nitride and hydrated alumina were observed in the X-ray diffraction pattern after the water-resistance test.

Example 2

To a mixture (250 ml) of isopropyl alcohol and n-hexane (1:1) in a vessel having 1 ( capacity, an aluminium nitride powder (100 g) having the average particle size of 4.3 μm and the oxygen content of 0.66 % was added and mixed with stirring to prepare an aluminium nitride dispersion. The dispersion was warmed to about 60° C. while stirring by vibrating the vessel on the water bath.

Next, a solution of a butyl acid phosphate (3 g) in a mixture (50 ml) of isopropyl alcohol and n-hexane (1:1) was added dropwise to the dispersion to react the aluminium nitride with the butyl acid phosphate slowly. Dry inert gas was passed through the vessel for preventing the penetration of water into the system during the reaction.

After the completion of the reaction, the resultant product was heated in the atmosphere at 500° C. for 5 hours to obtain the aluminium nitride powder treated with the butyl acid phosphate.

The above procedure was repeated except that the butyl acid phosphate was replaced with other organic compounds which were soluble in isopropyl alcohol or n-hexane to obtain the aluminium nitride powders treated with the organic compounds, provided that the heat treatment was omitted when the organic compounds other than the organic phosphoric acid compounds were used.

The water-resistance of each of the resultant aluminium nitride powders was examined as in Example 1.

The results are shown in Table 2.

TABLE 2

| treating agent | immediately after | 10 minutes after | 30 minutes after | 1 hour after | 2 hours after | 3 hours after | 4 hours after | 5 hours after |
|---|---|---|---|---|---|---|---|---|
| untreated | 9.0 | >9.6 | | | | | | |
| invention | | | | | | | | |
| butyl acid phosphate | 5.6 | 5.6 | 5.6 | 5.6 | 5.6 | 5.6 | 5.6 | 5.6 |
| 2-ethylhexyl phosphate | 5.6 | 5.6 | 5.6 | 5.6 | 5.6 | 5.6 | 5.6 | 5.6 |
| lauryl acid phosphate | 5.6 | 5.6 | 5.6 | 5.6 | 5.6 | 5.6 | 5.6 | 5.6 |
| di-2-ethylhexyl pyrophosphate | 5.6 | 5.6 | 5.6 | 5.6 | 5.6 | >9.6 | | |
| 1-hydroxyethylidene-1,1-diphosphonic acid | 5.6 | 5.6 | 5.6 | 5.6 | 5.6 | 5.6 | 5.6 | 5.6 |
| comparison | | | | | | | | |
| paraffin wax | 9.0 | >9.6 | | | | | | |
| sorbitan monooleate | 7.8 | >9.6 | | | | | | |
| β(3,4-epoxy-cyclohexyl)ethyl-trimethoxysilane | 5.6 | 8.2 | >9.6 | | | | | |

As clear from the results in Table 2, the aluminium nitride powders treated with the organic phosphoric acid compounds followed by the heat treatment according to the present invention showed almost no or no pH change even if the dispersion was stored for at least 2 hours after its preparation. While, in the aluminium nitride powders treated with the other organic compounds the pH value raised above 9.6 after 10 to 30 minutes of the preparation of the dispersion. An odor characteristic of ammonia was also detected.

As the comparison products, the aluminium nitride powder treated with butyl acid phosphate without the following heat treatment and the aluminium nitride powder treated with β (3,4-epoxycyclohexyl)ethyl trimethoxysilane followed by heating in the atmosphere at 500° C. for 5 hours were provided. In these aluminium nitride powders, the pH value raised above 9.6 after 1 hour of the preparation of the dispersion.

Example 3

The procedure of Example 1 was repeated except that the aluminium nitride powder having the average particle size of 1.1 μm and the oxygen content of 1.42 % was used to obtain the aluminium nitride powder treated with the orthophosphoric acid.

The water-resistance of the resultant aluminium nitride powder was examined by determining the change with respect to the oxygen content immediately after the preparation of the powder and after immersing it in water at 80° C. for 5 hours using an Oxygen/Nitrogen Analyzer (EMGA-2800; Horiba, Ltd.).

The oxygen content in the aluminium nitride powder treated with the orthophosphoric acid immediately after its preparation was 2.56 % and its oxygen content after immersing in water at 80° C. for 5 hours was 2.43 %. As clear from this result, the change with respect to the oxygen content was not found in the aluminium nitride powder treated with the orthophosphoric acid according to the present invention.

While, the oxygen content in the untreated aluminium nitride was remarkably increased to 21.5 % after immersing in water at 80° C. for 5 hours.

Next, the thermal conductivity of a sintered body produced from the above aluminium nitride powder treated with the orthophosphoric acid was determined using a Laser-Flash Thermal Constant Analyzer (Rigaku Corp.).

The aluminium nitride powder treated with the orthophosphoric acid was mixed with 3 % yttrium oxide and the mixture was shaped into a sheet, which was sintered at 1850° C. under the normal pressure for 1 hour.

The resultant sintered body showed the high thermal conductivity (110 W/mK).

Further, a solution obtained by thermally decomposing a piece of the sintered body under high pressure using a concentrated hydrochloric acid solution was subjected to the Inductive Coupled Plasma emission analysis. Its phosphorus P content was below 50 ppm.

Example 4

To an isopropyl alcohol (200 ml) in a flask having 1l capacity, an aluminium nitride powder (100 g) having the average particle size of 4.3 μm and the oxygen content of 0.66 % was added and mixed with stirring to prepare an aluminium nitride dispersion. Next, a solution of 85 % orthophosphoric acid (0.5 g) in isopropyl alcohol (50 ml) was added dropwise to the dispersion to react the aluminium nitride with the orthophosphoric acid slowly while warming the dispersion to about 60° C. and stirring by vibrating the flask on the water bath.

After the completion of the reaction, it was confirmed that the pH value on the pH-test paper was above 4.5 and then the remaining isopropyl alcohol was evaporated using a vacuum pump to obtain the aluminium nitride powder treated with the orthophosphoric acid.

Next, the performance of the resultant aluminium nitride powder as the filler was examined.

The aluminium nitride powder treated with the orthophosphoric acid (70 g) and silicone rubber (5H 746U; Toray Silicone) (30 g) were kneaded with a twin-roll mill and then shaped into a sheet having a thickness of about 1.8 mm.

The water-resistance of the aluminium nitride-rubber composite material thus prepared was determined by standing in the bath keeping the temperature at 35° C. and the humidity at 75 % for 24 hours, transferring a part (1 g) of an exudate in the bath into a flask (100 ml) with a stopper and heating the flask at 200° C. for 30 minutes. The ammonia gas produced in the flask was absorbed with a 0.5 % boric acid solution (100 ml) so as to detect the ammonia. Only 0.5 μl or less of the ammonia gas was detected.

While, the composite material containing the untreated aluminium nitride powder was examined under the same condition. About 50 μl of ammonia gas was detected.

Further, the thermal conductivity of this composite material was determined using a Quick Thermal Conductivity Meter QTM-D3; Kyoto Electronics Manufacturing CO., LTD.). It was 1.3 W/mK which was same as that of the composite material containing the untreated aluminium nitride powder.

Example 5

To an isopropyl alcohol (200 ml) in a flask having 1 l capacity, an aluminium nitride powder (100 g) having the average particle size of 1.1 μm and the oxygen content of 1.39 % was added and mixed with stirring to prepare an aluminium nitride dispersion. Next, a solution of a butyl acid phosphate (0.5 g) in isopropyl alcohol (50 ml) was added dropwise to the dispersion to react the aluminium nitride with the butyl acid phosphate slowly while warming the dispersion to about 60° C. and stirring by vibrating the flask on the water bath.

After the completion of the reaction, it was confirmed that the pH value on the pH-test paper was about 4.5 and then the remaining isopropyl alcohol was evaporated using a vacuum pump followed by heating in the atmosphere at 450° C. for 1 hour to obtain the aluminium nitride powder treated with the butyl acid phosphate.

The water-resistance of the resultant aluminium nitride powder was examined as in Example 1.

In the aluminium nitride powder treated with the butyl acid phosphate according to the present invention, the pH value of the dispersion raised above 9.6 after 12 hours of its preparation. While the pH value in the untreated aluminium nitride powder raised above 9.6 after only 1.5 hour of the preparation of the dispersion.

The water-resistance of the resultant aluminium nitride powder was also examined by determining the change with respect to the oxygen content immediately after the preparation of the powder and after immersing it in water at 40° C. for 5 hours using an Oxygen/Nitrogen Analyzer (EMGA-2800; Horiba Ltd.).

The oxygen content in the aluminium nitride powder treated with the butyl acid phosphate immediately after its preparation was 1.77% and its oxygen content after immersing in water at 40° C. for 5 hours was 1.74%. As clear from this result, the change with respect to the oxygen content was not found in the aluminium nitride powder treated with the butyl acid phosphate according to the present invention.

While, the oxygen content in the untreated aluminium nitride powder was remarkably increased to 20.4% after immersing in water at 40° C. for 5 hours.

Next, the thermal conductivity of a sintered body produced from the above aluminium nitride powder treated with the butyl acid phosphate was determined as in Example 3.

A ball mill was charged with the aluminium nitride powder treated with the butyl acid phosphate, a 5% $Y_2O_3$ as a sintering aid, a 3% aqueous acrylic binder (ESZ-1311, NV 42%; Chuo Rika Kogyo K. K.) ( in terms of its solid component), a 1% ammonium salt of acrylic oligomer (Aron A-6114) as a dispersant and a proper quantity of water, and mixed for 1.5 hour. This mixture was defoamed in vacuum to form a water slurry having a 70% solid component. Then, the slurry was shaped into a sheet by a doctor blade and dried at room temperature for 48 hours to form a green sheet of aluminium nitride having a 0.8 mm thickness, which was degreased and sintered at 1850° C. under normal atmosphere for 3 hours.

The resultant sintered body showed the high thermal conductivity (154 W/mK) which was same as that of the sintered body of the untreated aluminium nitride powder.

Further, a solution obtained by thermally decomposing a piece of the sintered body under high pressure using a concentrated hydrochloric acid solution was subjected to the Inductive Coupled Plasma emission analysis. Its phosphorus P content was below 50 ppm.

Example 6

In an alumina pot having 2 l capacity and containing alumina balls having the diameter of 10 mm (3.75 kg), an aluminium nitride powder (390 g) having the average particle size of 4.3 μm and the oxygen content of 0.66% and then a butyl acid phosphate (2 g) were added and milled using a vibration mill (Chuo Kakohki Co., Ltd.) for 5 hours followed by heating in the atmosphere at 450° C. for 1 hour to obtain the aluminium nitride powder having the average particle size of 1.2 μm and the oxygen content of 1.5.

The water-resistance of the resultant aluminium nitride powder was examined.

The aluminium nitride powder (4.1 g) was added to the pure water (54 g) having pH of about 5.6 and a temperature of 40° C. and mixed with stirring to prepare an aluminium nitride dispersion. Then, the pH change at 40° C. with time was determined with the pH-test paper. The pH value raised above 9.6 after 12 hours of its preparation.

While, in the similar aluminium nitride powder without the following heat treatment the pH value of the dispersion raised above 9.6 after only 1.5 hours of its preparation. In either case, the odor characteristic of ammonia was detected when the pH value raised above 9.6.

EFFECT OF THE INVENTION

The aluminium nitride powder treated with the inorganic or organic phosphoric acid compound according to the present invention has the improved water-resistance and accordingly, the production of ammonia and the increase of the oxygen content is not found during its storage and usage.

According to the present invention, the aluminium nitride powder has little tendency of flocculating during its storage and usage. Therefore, the aluminium nitride powder according to the present invention can be said to be suitably used as the filler for encapsulating material for IC and the filler for the synthetic resin or rubber admixture.

According to the present invention, water can be used as the shaping medium in the preparation of the sintered body because the aluminium nitride powder has the improved water-resistance and when water is practically used as the shaping medium, the sintered body having the desired thermal conductivity can be prepared because the oxygen content in the powder does not almost increase. Further, various shaping methods such as slip casting or tape casting can be applied in the preparation of the sintered body because the aluminium nitride powder according to the present invention can be easily dispersed in water owing to the formation of the hydrophilic coatings on the surface of each particle. Therefore, the aluminium nitride powder according to the present invention can be said to be suitably used as the starting material for the preparation of the sintered body of aluminium nitride.

According to the present invention, the aluminium nitride powder having the improved water-resistance can be prepared at a low cost because the special and additional step(s) are unnecessary in its preparation.

What is claimed is:

1. An aluminium nitride powder having improved water-resistance, which is treated with an organic phosphoric acid compound followed by heating at about 150° to 800° C.

2. A powder according to claim 1, wherein the aluminium nitride powder has the average particle size of from 0.1 μm to 1 mm.

3. A powder according to claim 1, which is treated with the organic phosphoric acid compound in an amount of 0.1 to 10 parts by weight based on 100 parts by weight of the aluminium nitride powder.

4. A powder according to claim 1, wherein the organic phosphoric acid compound is an acid phosphate, an alkyl-, alkenyl- or aryl-ester of pyrophosphoric or polyphosphoric acid, a phosphonic acid or an ester thereof, or a mixture thereof.

5. A powder according to claim 4, wherein the acid phosphate is methyl acid phosphate, ethyl acid phosphate, butyl acid phosphate, 2-ethylhexyl acid phosphate, lauryl acid phosphate, palmityl acid phosphate, stearyl acid phosphate, oleyl acid phosphate, phenyl acid phosphate or nonylphenyl acid phosphate.

6. A powder according to claim 4, wherein the alkyl-, alkenyl-or aryl-ester of pyrophosphoric or polyphosphoric acid is di-2-ethylhexyl pyrophosphate.

7. A powder according to claim 4, wherein the phosphonic acid or an ester thereof is methylene phosphonic acid, amino methylene, respectively; phosphonic acid, (t-butyl)nitrilobis methylene phosphonic acid, (n-butyl)-nitrilobis methylene phosphonic acid, nitrilotris methylene phosphonic acid, ethylene diamine tetramethylene phosphonic acid, 1-hydroxyethylidene-1,1-diphosphonic acid, butyl hydrogenphosphite, 2-ethylhexyl hydrogenphosphite, lauryl hydrogenphosphite or dibutylhydroxymethyl phosphonate.

8. A method for treating an aluminium nitride powder to improve its water-resistance comprising dispersing the aluminium nitride powder in a solvent, adding an inorganic or organic phosphoric acid compound to the dispersion, reacting the inorganic or organic phosphoric acid compound with the aluminium nitride and removing the solvent followed by heating the resultant powder at about 150° to 800° C. when the organic phosphoric acid is used.

9. A method according to claim 8, wherein the solvent is a lower alcohol or a mixture of a lower alcohol with an alkane or acetone.

10. A method for treating an aluminium nitride powder to improve its water-resistance comprising dry-type milling the aluminium nitride powder with an organic phosphoric acid compound, reacting the organic phosphoric acid compound with the aluminium nitride and heating the resultant powder at about 150° to 800° C.

11. A method according to claim 8 or 10, wherein the reaction temperature is in a range of room temperature to 80° C.

12. A method according to claim 8 or 10, wherein the inorganic or organic phosphoric acid compound is in an amount of 0.1 to 10 parts by weight based on 100 parts by weight of the aluminium nitride powder.

13. An aluminum nitride powder having improved water-resistance, which is treated with an inorganic phosphoric acid compound comprising orthophosphoric acid, pyrophosphoric acid, polyphosphoric acid, phosphorous acid, hypophosphorous acid, metaphosphoric acid or a mixture thereof.

* * * * *

UNITED STATES PATENT AND TRADEMARK OFFICE

CERTIFICATE OF CORRECTION

PATENT NO. : 4,923,689

DATED : May 8, 1990

INVENTOR(S) : Uenishi et al

It is certified that error appears in the above-identified patent and that said Letters Patent is hereby corrected as shown below:

On the title page, the title of the invention should read:

--[54] ALUMINUM NITRIDE POWDER HAVING IMPROVED WATER-RESISTANCE--

Signed and Sealed this

Seventeenth Day of December, 1991

Attest:

HARRY F. MANBECK, JR.

Attesting Officer

Commissioner of Patents and Trademarks